US006404246B1

United States Patent
Estakhri et al.

(10) Patent No.: US 6,404,246 B1
(45) Date of Patent: Jun. 11, 2002

(54) PRECISION CLOCK SYNTHESIZER USING RC OSCILLATOR AND CALIBRATION CIRCUIT

(75) Inventors: Petro Estakhri, Pleasanton; Mahmud Assar, Morgan Hill; Parviz Keshtbod, Los Altos Hills, all of CA (US)

(73) Assignee: Lexa Media, Inc., Fremont, CA (US)

( * ) Notice: Subject to any disclaimer, the term of this patent is extended or adjusted under 35 U.S.C. 154(b) by 0 days.

(21) Appl. No.: 09/741,971

(22) Filed: Dec. 20, 2000

(51) Int. Cl.[7] .............................. H03L 7/06
(52) U.S. Cl. ...................... 327/156; 327/147
(58) Field of Search ................ 327/147, 148, 327/151, 155, 156, 157, 160, 162, 163; 331/1 R, 11, 3–111; 375/226, 294, 374, 375; 324/521, 617, 622

(56) References Cited

U.S. PATENT DOCUMENTS

| | | | |
|---|---|---|---|
| 4,039,966 A | * 8/1977 | Skinner | 331/11 |
| 4,167,711 A | 9/1979 | Smoot | 331/17 |
| 4,442,412 A | * 4/1984 | Smith et al. | 331/1 |
| 4,675,617 A | 6/1987 | Martin | 331/1 A |
| 4,926,141 A | 5/1990 | Herold et al. | 331/16 |
| 4,931,748 A | 6/1990 | McDermott et al. | 331/1 A |
| 4,939,442 A | 7/1990 | Carvajal et al. | 323/281 |
| 4,970,408 A | 11/1990 | Hanke et al. | 307/272.3 |
| 4,980,652 A | 12/1990 | Tarusawa et al. | 331/1 A |
| 4,987,387 A | 1/1991 | Kennedy et al. | 331/1 A |
| 5,057,793 A | 10/1991 | Cowley et al. | 331/1 A |
| 5,072,197 A | 12/1991 | Anderson | 331/57 |
| 5,129,974 A | 7/1992 | Aurenius | 156/64 |
| 5,140,191 A | 8/1992 | Nogle et al. | 307/475 |
| 5,146,152 A | 9/1992 | Jin et al. | 323/280 |
| 5,173,656 A | 12/1992 | Seevinck et al. | 323/314 |
| 5,257,294 A | 10/1993 | Pinto et al. | 375/120 |
| 5,272,453 A | 12/1993 | Traynor et al. | 331/57 |
| 5,280,198 A | 1/1994 | Almulla | 307/296.6 |
| 5,281,927 A | 1/1994 | Parker | 331/1 A |
| 5,289,111 A | 2/1994 | Tsuji | 323/314 |
| 5,360,747 A | 11/1994 | Larson et al. | 437/8 |
| 5,382,922 A | * 1/1995 | Gersbach et al. | 331/1 |
| 5,508,635 A | 4/1996 | Kwon | 326/27 |
| 5,523,724 A | 6/1996 | Assar et al. | 331/1 A |
| 5,550,515 A | * 8/1996 | Liang et al. | 331/25 |
| 5,563,552 A | * 10/1996 | Gersbach et al. | 331/25 |
| 5,614,869 A | * 3/1997 | Bland | 331/1 |
| 5,668,503 A | * 9/1997 | Gersbach et al. | 331/25 |
| 5,724,007 A | * 3/1998 | Mar | 331/1 |
| 5,787,174 A | 7/1998 | Tuttle | 380/23 |
| 5,801,067 A | 9/1998 | Shaw et al. | 438/15 |
| 5,801,575 A | 9/1998 | Bouvier | 327/530 |
| 5,847,616 A | 12/1998 | Ng et al. | 331/57 |
| 5,950,115 A | * 9/1999 | Momtaz et al. | 327/147 |
| 6,018,265 A | 1/2000 | Keshtbod | 327/540 |
| 6,084,483 A | 7/2000 | Keshtbod | 331/57 |
| 6,124,764 A | * 9/2000 | Haarten et al. | 331/111 |

FOREIGN PATENT DOCUMENTS

JP          60-53320          3/1985    ......... H03K/3/354

* cited by examiner

Primary Examiner—Terry D. Cunningham
Assistant Examiner—Linh Nguyen
(74) Attorney, Agent, or Firm—Haverstock & Owens LLP

(57) ABSTRACT

A system and method of generating an output signal of very precise frequency without the use of a crystal oscillator. An input signal is generated using any convenient such as an RC oscillator. A circuit for producing a frequency-controlled output signal comprises a phase lock loop having a VCO and a down counter. The down counter reduces the frequency of a VCO clock signal in accordance with a down count value. The down count value is loaded in a register and stored in non-volatile memory. The down count value is set during a calibration operation using a precision external clock signal. In this way, a clock signal with a highly precise frequency is generated without using a crystal oscillator.

11 Claims, 3 Drawing Sheets

Typical Clock Synthesizer

PRECISION CLOCK SYNTHESIZER USING RC OSCILLATOR AND CALIBRATION CIRCUIT

FIELD OF THE INVENTION

This invention relates to a circuit for generating a clock signal and for controlling the frequency of the clock signal. More particularly, it relates to individually calibrating a preset value of a digital counter at the time of manufacture to control the frequency of a clock output.

BACKGROUND OF THE INVENTION

Many applications require the generation of an accurate clock frequency for internal operations of a synchronous system. FIG. 1 shows a conventional phase lock loop (PLL) clock synthesizer. Conventional PLL design criteria and methods are well known. A reference oscillator signal 100 is coupled as a first input to a phase detector 102. The phase detector 102 provides up/down signals as inputs to a charge pump and filter 104. The voltage output from the charge pump and filter 104 is provided as an input to a voltage controlled oscillator VCO 106. In response to the voltage generated by the charge pump and filter 104, the VCO 106 generates a VCO Clock signal 108 that is the output of the system of FIG. 1. The VCO clock signal 108 is also coupled as an input to a down counter 110. The down counter 110 reduces the frequency of the VCO clock signal 108 in accordance with a preset count value. The down counter 110 applies its output as a second input to the phase detector 102. The phase detector compares the signal from the down counter 110 to the reference oscillator signal 100 and determines which is faster. The phase detector will either provide an up or a down signal to the charge pump and filter depending upon whether the reference oscillator signal 100 or the output of the down counter 110 is slower. In this way the VCO clock 108 is a multiple of the reference oscillator signal 100 by a ratio established by the down counter 110.

According to conventional practice designers utilize a crystal controlled oscillator to generate the desired reference oscillator. A crystal is an external component to an integrated circuit. Even when mass produced, however, a crystal clock driver can be prohibitively expensive. This means that the use of a crystal adds expense to a system implementation. The cost of a crystal can be significant with respect to the cost of an integrated circuit. In inexpensive digital applications, however, such as digital film for a digital camera, the presence of a crystal oscillator adds to the product costs. Also, the printed circuit board must accommodate the presence of the crystal. This increases the size and the complexity of the printed circuit board, which translates to increased cost. In addition, a crystal oscillator has a relatively slow start time after the application of power to the circuit. Keeping the power applied to the circuit at all times to avoid this slow restart condition can violate the low power condition desired during an idle mode. Another drawback of a crystal oscillator is that the physical size of a crystal is relatively large, in comparison to a resistor and capacitor. In certain applications such as digital film, the size of the crystal can cause the overall size of the product to be undesirably large. In certain of such applications, the crystal height is sufficiently high that the PCB will not fit in the digital film cartridge.

At least these factors all indicate that using a crystal oscillator is disadvantageous. Yet, owing to the need for a high precision clock signal, integrated circuit designers and digital system designers conventionally use crystal oscillators for generating clock signals.

RC circuits have long been used to create an oscillating signal. RC oscillators are far cheaper than crystal oscillators, and can undesirably increase the cost in applications such as digital film. RC oscillators can be designed to track both power supply and temperature variations. Unfortunately, the manufacturing tolerances in RC components typically run in the five to ten percent range. In addition, semiconductor devices that are conventionally used in RC oscillators vary as a result of variations in the manufacturing process used to fabricate such devices. Thus, while RC oscillators can be made to operate at a constant and unvarying frequency, the initial frequency of an RC oscillator may not operate at a desired frequency.

There remains therefore a need for a system and method of developing a clock mechanism for use in digital circuits while avoiding the use of expensive crystal oscillators. There further remains a need for a system and method of using inexpensive RC oscillators in digital applications. There further remains a need to tune or adjust each RC circuit individually to compensate for the component variation inherent within each RC circuit element. There further remains a need for developing an RC oscillator that can reliably generate a signal satisfying the narrow tolerances of the digital applications.

BRIEF SUMMARY OF THE INVENTION

The present invention provides a system for and method of developing a clock mechanism for use in digital circuits that avoids the use of crystal oscillators in clock signal generation. The present invention further provides a system for and method of using a relatively inexpensive RC oscillator in digital applications. The present invention further provides means for tuning each signal generator individually to compensate for the component variation within each circuit. The present invention further provides means for achieving far greater frequency accuracy than is normally possible through use of RC oscillators, thereby satisfying circumstances requiring narrow tolerances.

According to one embodiment of the present invention, a circuit for producing a frequency-controlled output signal comprises a phase lock loop. A reference clock is coupled as a first input to a phase detector. Preferably, the reference clock is generated by an RC oscillator. The phase detector provides up/down signals as inputs to a charge pump and filter. The voltage output from the charge pump and filter is provided as an input to a voltage controlled oscillator VCO. In response to the voltage generated by the charge pump and filter, the VCO generates a VCO Clock signal. The VCO clock signal is also coupled as an input to a programmable down counter. The down value controls the frequency of the VCO clock signal. The down count value is loaded into a register via an internal bus.

The down counter applies its output as a second input to the phase detector. The phase detector compares the signal from the down counter to the reference oscillator signal and determines which is faster. The phase detector will either provide an up or a down signal to the charge pump and filter depending upon whether the reference oscillator signal or the output of the down counter is slower. In this way the VCO clock is a multiple of the reference oscillator signal by a ratio established by the down counter, which is adjustable.

According to one embodiment of the present invention, the phase lock loop is coupled to a calibration system which measures the frequency of the VCO clock. The calibration system is used to calibrate the oscillator circuit during a manufacturing process. Once the oscillator circuit is calibrated, it will operate at the calibrated clock frequency without the need for further calibration. The calibration system includes a precision external clock signal which is compared to the VCO clock signal. The result of the comparison operation is used to alter the down count value which is kept in the down-count register. The down count value is changed until the VCO clock signal matches the precision external clock signal within one period of the RC reference clock. After the desired down count value is determined, it is stored into the non-volatile memory so that the calibration need never be repeated. During a power on sequence, the value stored in the non-volatile memory is loaded into the count-value register for normal operation.

According to one embodiment of the present invention, a method of calculating a counter preset value affecting a frequency of an output signal such that the frequency of the output signal closely matches a frequency of a highly precise reference signal comprises the steps of incrementing the counter preset value to a new value, generating a new output signal having a frequency affected by the new counter preset value and measuring the error in frequency between the new output signal and the highly precise reference signal.

According to another embodiment of the present invention, a method of producing a highly accurate clock output signal comprises the steps of loading an individually-calculated down count value into a count-value register, dividing-down the frequency of a VCO output signal by the value of the count-value register, transmitting the divided-down frequency into the first input of the frequency comparator; and transmitting a reference clock signal into the second input of the frequency comparator.

These and other advantages will become known to those of ordinary skill in the art after reading the following detailed description of the preferred embodiments which are illustrated in the various drawings and figures.

BRIEF DESCRIPTION OF THE SEVERAL VIEWS OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. For example, other inexpensive and innaccurate oscillators can be used instead of an RC oscillator. Furthermore, in the following detailed description of the present invention, numerous specific details are set forth in order to provide a thorough understanding of the present invention. However, it will be clear to one of ordinary skill in the prior art that the present invention may be practiced without these specific details. In other instances, well-known methods and procedures, components and circuits are not described in detail so as not to unnecessarily obscure aspects of the present invention.

It should be further borne in mind that, in discussions of electrical circuits, the terms "coupled," "operatively coupled," "electrically coupled," and like terms denote an electrical path between two components. It is understood, however, that such terms do not preclude the presence of additional components interposed between the two original components. Only through use of the term "directly connected," or like terms, is it intended to denote an electrical connection between two components that precludes any additional components, other than an electrical conductor or optical pathway, interposed between the two original components.

Figure 1:
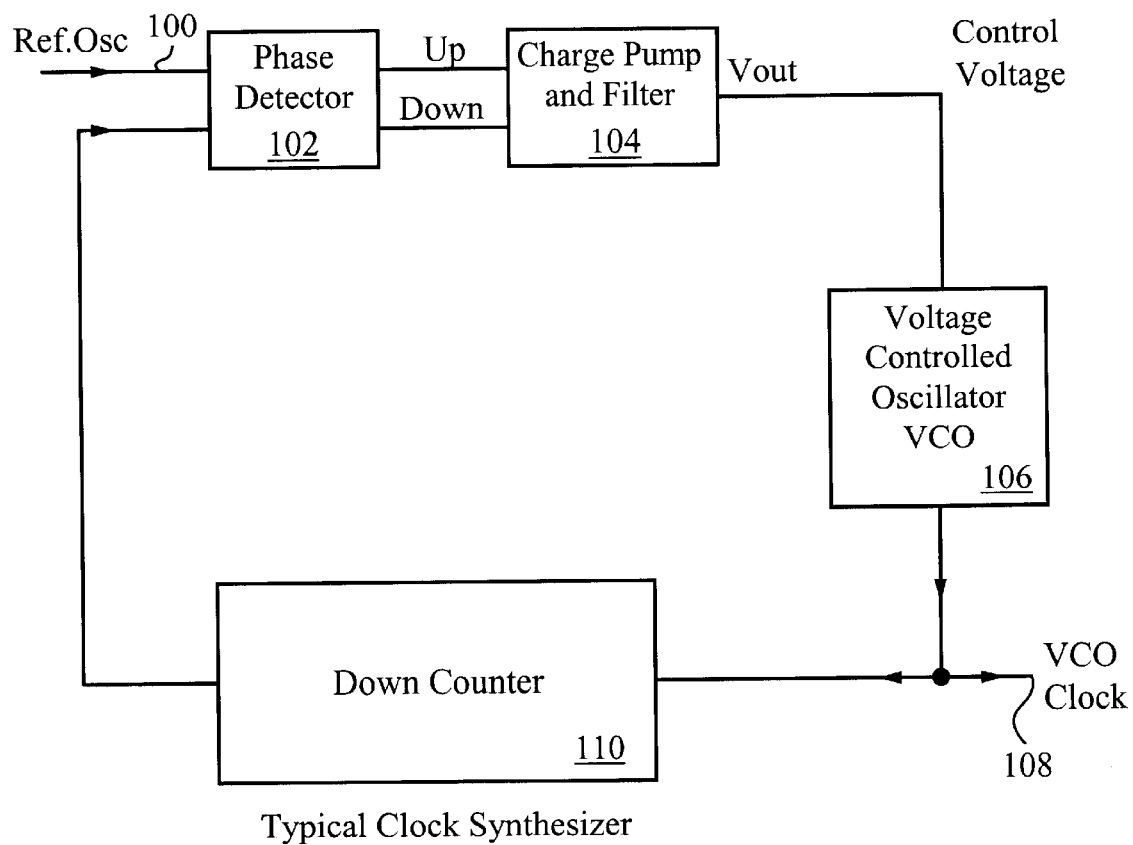
FIG. 1 shows a block diagram of a prior art phase lock loop clock synthesizer.
Figure 2:
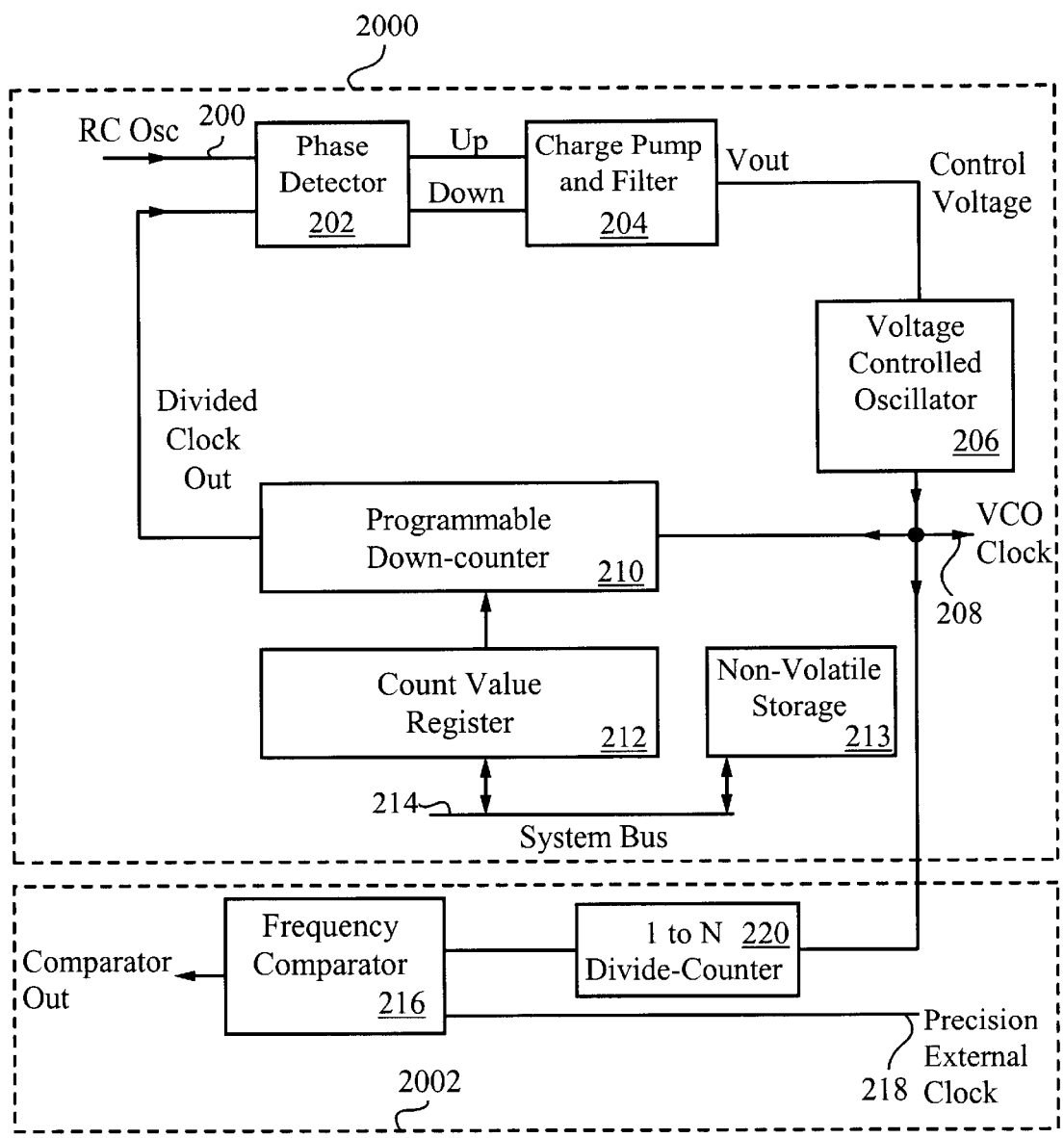
FIG. 2 shows a block diagram of the preferred embodiment of the present invention.

FIG. 2 shows a phase lock loop clock synthesizer 2000 according to the present invention. A reference oscillator signal 200 is coupled as a first input to a phase detector 202. Preferably the reference oscillator signal is generated by an RC oscillator. The frequency of the signal can be designed to be relatively insensitive to power supply and temperature variations.

The phase detector 202 provides up/down signals as inputs to a charge pump and filter 204. The voltage output from the charge pump and filter 204 is provided as an input to a voltage controlled oscillator VCO 206. In response to the voltage generated by the charge pump and filter 204, the VCO 206 generates a VCO Clock signal 208 that is the clock output of the system of FIG. 2.

The VCO clock signal 208 is also coupled as an input to a programmable down counter 210. The programmable down counter 210 reduces the frequency of the VCO clock signal 208 in accordance with a programmable count value. The programmable count value is loaded in a register 212. Preferably, the register 212 is formed of volatile memory. The final value is also stored in a non-volatile memory 213 so that the frequency of the VCO clock 208 is returned to the same value even after power is removed and then reapplied. The programmable down counter 210 applies its output as a second input to the phase detector 202. The phase detector compares the signal from the down counter 210 to the reference oscillator signal 200 and determines which is slower. The phase detector will either provide an up or a down signal to the charge pump and filter depending upon whether the reference oscillator signal 200 or the output of the down counter 210 is faster. In this way the VCO clock 208 is a multiple of the reference oscillator signal 200 by a ratio established by the down counter 210.

The frequency of the VCO clock 208 can be varied by changing the programmed count value in the register 212. According to the preferred embodiment, the register 212 is programmed via a system bus 214. Once the final value of the down counter is determined, the value in the register 212 is stored into a non-volatile memory 213. This prevents the final value from changing unless the system is recalibrated. In this way, the frequency of the system is very stable. The non-volatile memory 213 can be FLASH memory, EEPROM, PROM, programmable fuses, and the like. Further, the non-volatile memory 213 can be formed within the integrated circuit or reside off chip. The non-volatile memory 213 can be coupled to the register 212 through the system bus 214 or directly during the power-on sequence.

The clock synthesizer 2000 can be readily calibrated using a calibration system 2002. The clock synthesizer 2000 is coupled to a calibration system during a factory test and calibration procedure. The VCO clock 208 is coupled as an input to a down counter 220 and its output is coupled to a frequency comparator 216. A precision external clock 218 is also applied to the frequency comparator 216. The precision external clock 218 is only used during a calibration operation for the manufacture of a system that incorporates the present invention. There is only need for one such precision external clock 218 which can be used to calibrate any number of systems. The frequency comparator compares the frequency of the VCO clock 208 to the precision external clock to determine which is faster. The output of the comparator is used to generate a new count value that is loaded in the register 212. Once a final value is determined for the count value, it is stored into the non-volatile memory 213.

In case the precision external clock 218 has a frequency different than the VCO clock 208, the VCO clock 208 can be coupled to a divide counter 220 to reduce the frequency of the VCO clock 208 to that of the precision external clock 218. In that situation, the VCO clock 208 is a multiple of the precision external clock 218. The 1 to N divide counter 220 divides the frequency of the VCO clock 208 to reduce the frequency to a frequency that will equal the frequency of the precision external clock 218. The output of the divide counter 220 is coupled as an input to the frequency comparator 216. The precision external clock 218 is also coupled as an input to the frequency comparator 216. The frequency comparator 216 compares the divided frequency of the VCO clock 208 to the frequency of the precision external clock 218 in the manner described above.

As described above, using an RC oscillator can introduce errors in the oscillation frequency as a result of variations among resistors, capacitors and circuit parameters. These errors are a result of resistors and capacitors not generally being precision devices. These tolerance variations can cause the frequency of a clock synthesizer to fall outside of a desired specification. Additionally, actual variations in operational speeds can occur as a result of the semiconductor processing parameters associated with the manufacture of individual integrated circuits. However, here, by programming the down count value, the frequency can be calibrated and adjusted to be accurate within a very tight tolerance, regardless of the actual value of the resistor, the capacitor or the semiconductor processing of the circuit.

Figure 3:
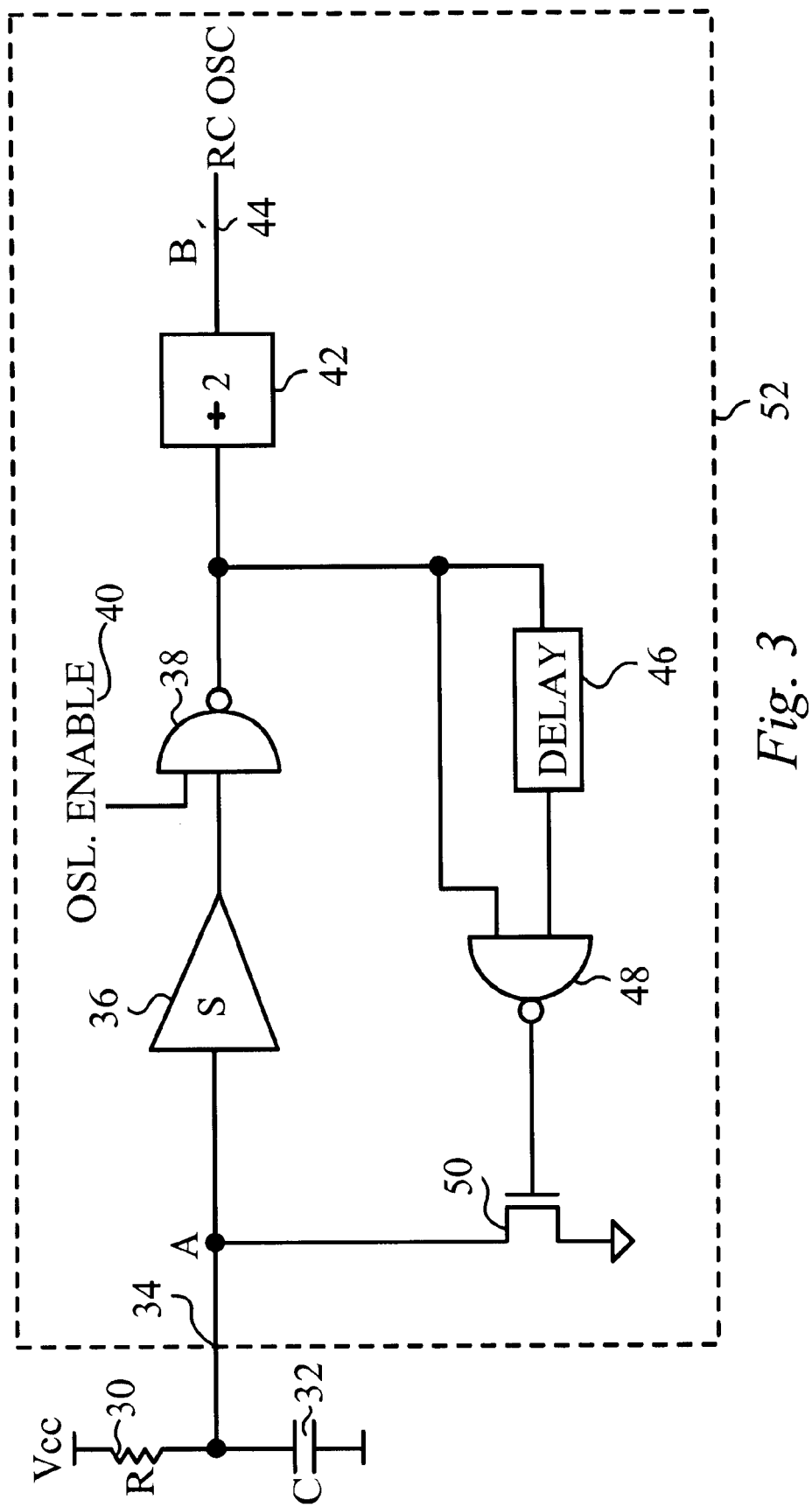
FIG. 3 shows a block diagram of an RC oscillator for use in the present invention.

FIG. 3 shows an example of a relaxation RC oscillator and input oscillation circuit for use with the present invention. It will be apparent to one of ordinary skill in the art that any inexpensive oscillator, such as a ring oscillator, can be used according the teachings of this invention. An RC oscillator is desired because it can be manufactured inexpensively and can also be designed to be relatively constant regardless of variations of temperature or supply voltage.

According to FIG. 3, a resistor 30 is coupled between a supply voltage Vcc and an input node 34. A capacitor 32 is coupled between the input node 34 and a ground potential. For the preferred integrated circuit implementation of the present invention, the resistor 30 and the capacitor 32 are external components to an integrated circuit 52. It is of course possible to build the components in the integrated ciruit 52. The input node 34 is coupled as an input to a special buffer 36. The output of the buffer 36 is coupled as one input to a first two input NAND gate 38. A second input of the first NAND gate 38 is coupled to receive an oscillator enable signal 40. The oscillator enable signal 40 can be used to activate or deactivate the oscillation circuit of FIG. 3.

According to the preferred embodiment, the output of the first NAND gate 38 is coupled as an input to a divide-by-two circuit 42 to produce a 50% duty cycle. The output 44 of the divide-by-two circuit 42 is coupled as the input to the circuit of FIG. 2. The output of the first NAND gate 38 is coupled as a first input to a second NAND gate 48 and to a delay cell 46. The output of the delay cell 46 is coupled as a second input to the second NAND gate 48. The output of the second NAND gate 48 is coupled to a gate of an n-channel MOS transistor 50. A drain of the MOS transistor 50 is coupled to the input node 34. A source of the MOS transistor 50 is coupled to a ground potential.

Current passes through the resistor 30 to charge the capacitor 32. Upon reaching a predetermined voltage level, the signal passes through the buffer 36 and to the first NAND gate 38. If the oscillator enable signal is set to a logical 'one' the circuit is enabled, and the first NAND gate 38 will invert the output of the buffer 36. This forces the output of the NAND gate 48 high and discharges the capacitor 32 through the n-channel gate 50. This takes the input of the buffer 36 to "zero." This results in the output of the NAND gate 38 to go high and after the delay time, the output of the NAND gate 48 will go low, which turns the n-channel gate 50 off, thereby allowing the capacitor 32 to start charging again.

If the circuit is disabled using the oscillator enable signal 40, the output of the first NAND gate 38 will not change. This acts to prevent the transistor 50 from discharging the input node 34. The voltage on the capacitor 32 rises to Vcc. Once, the capacitor 32 is charged there is no path for current to flow. The circuit draws no power, except for extremely low level leakage current. Further, there is no re-start time required to re-activate the oscillator as there is with a crystal oscillator circuit.

The present invention can readily be adapted for use as a clock signal generator for digital circuits. Using the present invention allows a manufacturer to assemble such devices using relatively inexpensive RC oscillators. Only a single crystal oscillator or other precision clock generator is required in a manufacturing calibration system. This vastly reduces the overall cost of such systems while maintaining the tight tolerances such devices require.

What is claimed is:

1. A clock synthesizer comprising:
   a. a reference oscillating signal having a first frequency;
   b. a phase detector coupled to receive the reference oscillating signal as a first input;
   c. a charge pump coupled to receive an up/down control from the phase detector for forming a voltage output;
   d. voltage controlled oscillator for producing a VCO clock signal having a second frequency in response to the voltage output;
   e. a precision external clock configured to generate a precision clock signal; and
   f. a down counter for receiving the VCO clock and forming a signal having a frequency approximately equal the first frequency and coupled as a second input to the phase detector, wherein the down counter is a programmable counter comprising a register for storing a count value, wherein the register receives a value from a calibration system, wherein the calibration system is removably coupled to receive the VCO clock signal, the calibration system being configured to compare the VCO clock signal and the precision clock signal and wherein the calibration system is configured to couple to the precision clock signal during a manufacturing process, such that the clock synthesizer is operable without the calibration system coupled thereto.

2. The clock synthesizer according to claim 1 wherein the reference oscillating signal is generated by an RC oscillator.

3. The clock synthesizer according to claim 1 wherein the first frequency is lower than the second frequency.

4. The clock synthesizer according to claim 3 wherein a frequency of an output of the down counter is lower than the second frequency.

5. The clock synthesizer according to claim 1 wherein the precision clock signal has a frequency lower than the VCO clock.

6. The clock synthesizer according to claim 5 wherein the VCO clock is coupled as an input to a down counter for providing a reduced frequency signal to the calibration signal.

7. An apparatus for calibrating a counter preset value selected to produce a signal closest in frequency to a highly precise external reference signal, the apparatus comprising:
   a. a first circuit comprising:
      i. a counter with a counter-input, a counter-output and a preset;
      ii. a first signal comparator with a first input, a second input, and an output; and
      iii. a controllable oscillator with an input and an output, the frequency of a signal generated through the controllable oscillator output being affected by the counter preset;
   b. a highly precise reference signal; and
   c. a second signal comparator with a first input, a second input, and an output; wherein the output of the counter is operatively coupled to the first input of the first signal comparator, the output of the first signal comparator is operatively coupled to the input of the controllable oscillator, and the output of the controllable oscillator is operatively coupled to the first input of the second signal comparator and the highly precise reference signal is operatively transmitted to the second input of the second signal comparator.

8. The apparatus according to claim 7, wherein the second signal comparator is integral to the first circuit.

9. The apparatus according to claim 7, wherein the second signal comparator is not integral to the first circuit.

10. A method of calculating an optimum counter preset value affecting a frequency of an output signal such that the frequency of the output signal closely matches a frequency of a highly precise external reference signal generated by a precision external clock, the method comprising the steps of:
   a. coupling the precision external clock to a frequency comparator;
   b. incrementing the counter preset value to a new preset value;
   c. generating a new output signal having a frequency affected by the new counter preset value;
   d. generating a new error value proportional to the frequency difference between the new output signal and the highly precise reference signal; and
   e. decoupling the precision external clock once a calibration operation is completed.

11. The method according to claim 10, further comprising the steps of:
   a. determining a final counter value that produces a smallest error value; and
   b. storing the final counter value in a non-volatile memory.

* * * * *